United States Patent
Kim et al.

(10) Patent No.: US 11,452,200 B2
(45) Date of Patent: Sep. 20, 2022

(54) FLEXIBLE CIRCUIT BOARD INCLUDING BENDING PART WITH IMPROVED SHIELDING PROPERTIES AND MANUFACTURING METHOD THEREOF

(71) Applicant: GigaLane Co., Ltd., Hwaseong-si (KR)

(72) Inventors: Sang Pil Kim, Hwaseong-si (KR); Byung Yeol Kim, Hwaseong-si (KR); Ik Soo Kim, Hwaseong-si (KR); Hee Seok Jung, Hwaseong-si (KR)

(73) Assignee: GIGALANE CO., LTD., Hwaseong-si (KR)

( * ) Notice: Subject to any disclaimer, the term of this patent is extended or adjusted under 35 U.S.C. 154(b) by 0 days.

(21) Appl. No.: 17/295,496

(22) PCT Filed: Nov. 20, 2019

(86) PCT No.: PCT/KR2019/015914
§ 371 (c)(1),
(2) Date: May 20, 2021

(87) PCT Pub. No.: WO2020/130373
PCT Pub. Date: Jun. 25, 2020

(65) Prior Publication Data
US 2021/0360773 A1 Nov. 18, 2021

(30) Foreign Application Priority Data

Dec. 19, 2018 (KR) .................. 10-2018-0164767

(51) Int. Cl.
*H05K 1/02* (2006.01)
(52) U.S. Cl.
CPC ........... *H05K 1/0221* (2013.01); *H05K 1/028* (2013.01); *H05K 1/0242* (2013.01); *H05K 2201/05* (2013.01)

(58) Field of Classification Search
CPC .... H05K 1/0221; H05K 1/0242; H05K 1/028; H05K 1/148; H05K 1/0245;
(Continued)

(56) References Cited

U.S. PATENT DOCUMENTS

| 5,499,444 A | * | 3/1996 | Doane, Jr | H05K 3/4691 |
| | | | | 174/254 |
| 2008/0286696 A1 | * | 11/2008 | Ueno | H05K 3/4691 |
| | | | | 430/319 |

(Continued)

FOREIGN PATENT DOCUMENTS

| JP | 2008515253 A | 5/2008 |
| JP | 2018041767 A | 3/2018 |

(Continued)

OTHER PUBLICATIONS

International Search Report from International Application No. PCT/KR2019/015914, dated Mar. 6, 2020.

*Primary Examiner* — Roshn K Varghese
(74) *Attorney, Agent, or Firm* — Brundidge & Stanger, P C

(57) ABSTRACT

An antenna carrier includes a flexible circuit board, the flexible circuit board comprising: a first dielectric formed to include a width direction and a length direction; a first signal line positioned on one side in the width direction of an upper surface or a lower surface of the first dielectric; a second signal line spaced apart from the first signal line to the other side in the width direction and positioned on the upper surface or the lower surface of the first dielectric; a second dielectric positioned on one side in the width direction above the first dielectric and having the first signal line positioned below the second dielectric; a third dielectric spaced apart from the second dielectric to the other side in the width direction and positioned below the first dielectric, and having the second signal line positioned above the third dielectric; a first ground; and a second ground.

19 Claims, 9 Drawing Sheets

(58) Field of Classification Search
CPC ......... H05K 2201/05; H05K 2201/091; H05K 2201/09036; H05K 2201/09045; H05K 2201/09909; H05K 2201/09136; H05K 2201/09127; H05K 2201/056; H05K 2201/09109; H05K 2201/0219; H05K 2201/0221; H05K 2201/0191; H05K 2201/09809; H05K 2201/09063; H05K 2201/09972; H05K 1/0219; H05K 1/118; H05K 1/189; H05K 1/0256; H05K 3/4691; H05K 3/4694; H05K 3/4688; F25B 39/04

See application file for complete search history.

(56) References Cited

U.S. PATENT DOCUMENTS

| | | | | |
|---|---|---|---|---|
| 2009/0133906 | A1* | 5/2009 | Baek | H05K 1/0218 |
| | | | | 174/254 |
| 2014/0376199 | A1* | 12/2014 | Kato | H05K 1/144 |
| | | | | 361/753 |
| 2015/0305142 | A1* | 10/2015 | Matsuda | H01P 3/082 |
| | | | | 29/601 |
| 2017/0084974 | A1* | 3/2017 | Baba | H05K 1/02 |

FOREIGN PATENT DOCUMENTS

| | | |
|---|---|---|
| KR | 1020170036339 A | 4/2017 |
| KR | 1020170036358 A | 4/2017 |
| KR | 1020170036364 A | 4/2017 |

* cited by examiner

FLEXIBLE CIRCUIT BOARD INCLUDING BENDING PART WITH IMPROVED SHIELDING PROPERTIES AND MANUFACTURING METHOD THEREOF

CROSS-REFERENCE TO RELATED APPLICATIONS

This Application is the National Stage filing under 35 U.S.C. § 371 of PCT Application Ser. No. PCT/KR2019/015914 filed on Nov. 20, 2019, which claims the benefit of Korean Patent Application No. 10-2018-0164767 filed on Dec. 19, 2018. The disclosures of both applications are hereby incorporated herein by reference in their entireties.

TECHNICAL FIELD

The present invention relates to a flexible circuit board having a bending part with improved shielding properties and a manufacturing method thereof.

BACKGROUND

A flexible circuit board for transmitting a high frequency signal is used within a wireless terminal (e.g., a smartphone, a tablet or the like).

The flexible circuit board separately forms an area to be bent according to the need of bending due to a step between internal parts or a hinge of the wireless terminal.

As shown in FIG. 1, a thickness of an area A1 to be bent of the flexible circuit board is less than that of the other areas.

FIG. 2 is a cross-sectional view of an area to be bent and FIG. 3 is a cross-sectional view of another area adjacent to the area to be bent.

The area to be bent as illustrated in FIG. 2 has a problem that it is vulnerable to noise interference because a thickness thereof is reduced by the removal of components including a first ground 310 and a second ground 320, compared to other areas shown in FIG. 3.

In particular, in the case of a flexible circuit board composed of two or more signal lines, there is a problem that interference between the signal lines occurs.

SUMMARY

Technical Problem

An object of the present invention is to provide a flexible circuit board having a bending part with improved shielding properties and a manufacturing method thereof.

Technical Solution

A flexible circuit board having a bending part with improved shielding properties according to an embodiment of the present invention includes: a first dielectric formed to include a width direction and a length direction; a first signal line positioned on one side in the width direction of an upper surface or a lower surface of the first dielectric; a second signal line spaced apart from the first signal line to the other side in the width direction and positioned on the upper surface or the lower surface of the first dielectric; a second dielectric positioned on one side in the width direction above the first dielectric and having the first signal line positioned below the second dielectric; a third dielectric spaced apart from the second dielectric to the other side in the width direction and positioned below the first dielectric, and having the second signal line positioned above the third dielectric; a first ground positioned on the second dielectric; and a second ground positioned under the third dielectric.

According to an embodiment of the present invention, the flexible circuit board includes a first cover positioned on the first dielectric, but formed from an entire or partial area below the second dielectric to an area above the third dielectric, and positioned so that at least a part of the first cover overlaps the second dielectric in a vertical direction; and a second cover positioned under the first dielectric, but formed from an entire or partial area above the third dielectric to an area below the second dielectric, and positioned so that at least a part of the second cover overlaps the third dielectric in the vertical direction.

According to an embodiment of the present invention, the flexible circuit board includes a third cover positioned on the first ground; and a fourth cover positioned under the second ground.

According to an embodiment of the present invention, the flexible circuit board includes a first center ground positioned between the first signal line and the second signal line, while being positioned on the upper surface of the first dielectric; and a second center ground positioned between the first signal line and the second signal line, while being positioned on the lower surface of the first dielectric, wherein the second dielectric is positioned to overlap at least a part of the first center ground in a vertical direction, wherein the third dielectric is positioned to overlap at least a part of the second center ground in the vertical direction.

According to an embodiment of the present invention, the flexible circuit board includes a first side ground positioned on one side in the width direction of the upper surface of the first dielectric; a second side ground positioned on the other side in the width direction of the upper surface of the first dielectric; a third side ground positioned on one side in the width direction of the lower surface of the first dielectric; and a fourth side ground positioned on the other side in the width direction of the lower surface of the first dielectric, wherein the first center ground is positioned between the first side ground and the second side ground, wherein the second center ground is positioned between the third side ground and the fourth side ground.

According to an embodiment of the present invention, the flexible circuit board includes a first bonding sheet positioned between the first dielectric and the second dielectric and covering an upper portion of a part of the first cover, which is interposed between the first dielectric and the second dielectric of the first cover and the second dielectric; and a second bonding sheet positioned between the first dielectric and the third dielectric and covering a lower portion of a part of the second cover, which is interposed between the first dielectric and the third dielectric of the second cover.

According to an embodiment of the present invention, the first ground is formed to have a width smaller than a width of the second dielectric so as not to overlap the first cover in the vertical direction and is positioned to be spaced apart from the first cover in a horizontal direction, and the second ground is formed to have a width smaller than a width of the third dielectric so as not to overlap the second cover in the vertical direction and is positioned to be spaced apart from the second cover in the horizontal direction.

According to an embodiment of the present invention, the flexible circuit board includes a third signal line spaced apart from the second signal line to the other side in the width direction and positioned on the upper or lower surface of the first dielectric; a fourth dielectric spaced apart from the third dielectric to the other side in the width direction and positioned above the first dielectric, and having the third signal line positioned below the fourth dielectric; a fifth cover positioned under the first dielectric, but formed from an entire or partial area above the third dielectric to an area below the fourth dielectric, and positioned so that at least a part of the fifth cover overlaps the third dielectric in a vertical direction; and a third ground positioned on the fourth dielectric.

According to an embodiment of the present invention, the flexible circuit board includes a first cover positioned on the first dielectric, but formed from an entire or partial area below the second dielectric to an entire or partial area below the fourth dielectric, and positioned so that at least a part of the first cover overlaps the second dielectric and the fourth dielectric in a vertical direction; a second cover positioned under the first dielectric, but formed from an entire or partial area above the third dielectric to an area below the second dielectric, and positioned so that at least a part of the second cover overlaps the third dielectric in the vertical direction; and a fifth cover positioned under the first dielectric, but formed from an entire or partial area above the third dielectric to an area below the fourth dielectric, and positioned so that at least a part of the fifth cover overlaps the third dielectric in the vertical direction.

According to an embodiment of the present invention, the flexible circuit board includes a third cover positioned on the first ground; a fourth cover positioned under the second ground; and a sixth cover positioned on the third ground.

According to an embodiment of the present invention, the flexible circuit board includes a first center ground positioned between the first signal line and the second signal line, while being positioned on the upper surface of the first dielectric; a second center ground positioned between the first signal line and the second signal line, while being positioned on the lower surface of the first dielectric, a third center ground positioned between the second signal line and the third signal line on the upper surface of the first dielectric; and a fourth center ground positioned between the second signal line and the third signal line on the lower surface of the first dielectric, wherein the second dielectric is positioned to overlap at least a part of the first center ground in the vertical direction, wherein the third dielectric is positioned to overlap at least a part of the second center ground and the fourth center ground in the vertical direction, wherein the fourth dielectric is positioned so that at least a part of the fourth dielectric overlaps the third center ground in the vertical direction.

According to an embodiment of the present invention, the flexible circuit board includes a first side ground positioned on one side in the width direction of the upper surface of the first dielectric; a second side ground positioned on the other side in the width direction of the upper surface of the first dielectric; a third side ground positioned on one side in the width direction of the lower surface of the first dielectric; and a fourth side ground positioned on the other side in the width direction of the lower surface of the first dielectric, wherein the first center ground and the third center ground are positioned between the first side ground and the second side ground, wherein the second center ground and the fourth center ground are positioned between the third side ground and the fourth side ground.

According to an embodiment of the present invention, the flexible circuit board includes a first bonding sheet positioned between the first dielectric and the second dielectric and covering an upper portion of a part of the first cover, which is interposed between the first dielectric and the second dielectric; a second bonding sheet positioned between the first dielectric and the third dielectric and covering a lower portion of a part of the second cover, which is interposed between the first dielectric and the third dielectric; and a third bonding sheet positioned between the first dielectric and the fourth dielectric and covering an upper portion of a part of the first cover, which is interposed between the first dielectric and the fourth dielectric.

According to an embodiment of the present invention, the first ground is formed to have a width smaller than a width of the second dielectric so as not to overlap the first cover in the vertical direction and is positioned to be spaced apart from the first cover in a horizontal direction, the second ground is formed to have a width smaller than a width of the third dielectric so as not to overlap the second cover and the fifth cover in the vertical direction and is positioned to be spaced apart from the second cover and the fifth cover in the horizontal direction, and the third ground is formed to have a width smaller than a width of the fourth dielectric so as not to overlap the first cover in the vertical direction and is positioned to be spaced apart from the first cover in the horizontal direction.

According to an embodiment of the present invention, a flexible circuit board having a bending part with improved shielding properties includes: a first dielectric formed to include a width direction and a length direction; a first signal line positioned on one side in the width direction of an upper surface or a lower surface of the first dielectric; a second signal line spaced apart from the first signal line to the other side in the width direction and positioned on the upper surface or the lower surface of the first dielectric; a first cover positioned on the first dielectric, while being formed to have a width smaller than a width of the first dielectric; a second cover positioned under the first dielectric and overlapping the first cover at least partially in a vertical direction, while being formed to have a width smaller than the width of the first dielectric; a second dielectric positioned on one side in the width direction above the first dielectric and having the first signal line positioned below the second dielectric; a third dielectric spaced apart from the second dielectric to the other side in the width direction and positioned below the first dielectric, and having the second signal line positioned above the third dielectric; a first ground positioned on the second dielectric; a second ground positioned under the third dielectric;

a third cover positioned on the first ground; and a fourth cover positioned under the second ground, wherein at least a part of one side of the first cover in the length direction is interposed between the first dielectric and the second dielectric, and a portion of the first cover that is not interposed between the first dielectric and the second dielectric is exposed, wherein at least a part of one side of the second cover in the length direction is interposed between the first dielectric and the third dielectric, and a portion of the second cover that is not interposed between the first dielectric and the third dielectric is exposed.

According to an embodiment of the present invention, at least a part of one side of the first cover in the width direction is interposed between the first dielectric and the second dielectric, and at least a part of the other side in the width direction of the second cover is interposed between the first dielectric and the third dielectric.

A manufacturing method of a flexible circuit board having a bending part with improved shielding properties according to an embodiment of the present invention includes: a first step of coupling a first cover onto a first dielectric; a second step of coupling a second dielectric onto the first dielectric to cover the first cover; and a third step of removing the second dielectric positioned on the first cover so that the second dielectric remains on at least a part of a circumference of the first cover.

A manufacturing method of a flexible circuit board having a bending part with improved shielding properties according to an embodiment of the present invention includes: a first step of coupling a first cover onto a first dielectric; and a second step of coupling a second dielectric which has been cut out to cover at least a part of a circumference of the first cover, onto the upper portion of the first dielectric.

Advantageous Effects

First, the second dielectric and the first ground are formed only in a portion above the first dielectric and have effects of shielding the first signal line from being interfered by noise while maintaining bendability, and the third dielectric and the second ground are formed only in a portion below the first dielectric and have effects of shielding the second signal line from being interfered by noise while maintaining bendability.

In addition, the second dielectric and the first ground, and the third dielectric and the second ground are point-symmetric with respect to the first dielectric, so that there is an effect of shielding interference between the first signal line and the second signal line.

In addition, the portion where the second dielectric is positioned above the first dielectric and the portion where the second dielectric is not positioned above the first dielectric may be bent in conjunction with each other, and the portion where the third dielectric is positioned below the first dielectric and the portion where the third dielectric is not positioned below the first dielectric may be bent in conjunction with each other, so that there are effects of preventing the portions from being damaged due to bending thereof at different angles.

Also, the first center ground has effects of shielding the first signal line from being interfered with by noise, together with the second dielectric and the first ground, and the second center ground has effects of shielding the second signal line from being interfered with by noise, together with the third dielectric and the second ground.

Also, since the first ground and the first cover do not overlap in the vertical direction and the second ground and the second cover do not overlap in the vertical direction, there is an effect of preventing an increase in the thickness of the flexible circuit board.

In addition, the third center ground has effects of shielding the third signal line from being interfered with by noise, together with the fourth dielectric and the third ground, and the fourth center ground has effects of shielding the second signal line from being interfered with by noise, together with the third dielectric and the second ground.

Also, the first side ground and the third side ground have effects of shielding the first signal line from being interfered with by noise, together with the first center ground and the second center ground, and the second side ground and the fourth side ground have effects of shielding the second signal line from being interfered with by noise, together with the first center ground and the second center ground.

In addition, since the third ground and the first cover do not overlap in the vertical direction, there is an effect of preventing an increase in the thickness of the flexible circuit board.

Moreover, the portion where the second dielectric is positioned above the first dielectric and the portion where the second dielectric is not positioned above the first dielectric may be bent in conjunction with each other, and the portion where the third dielectric is positioned below the first dielectric and the portion where the third dielectric is not positioned below the first dielectric may be bent in conjunction with each other, so that there are effects of preventing the portions from being damaged due to bending thereof at different angles.

DETAILED DESCRIPTION

Figure 1:
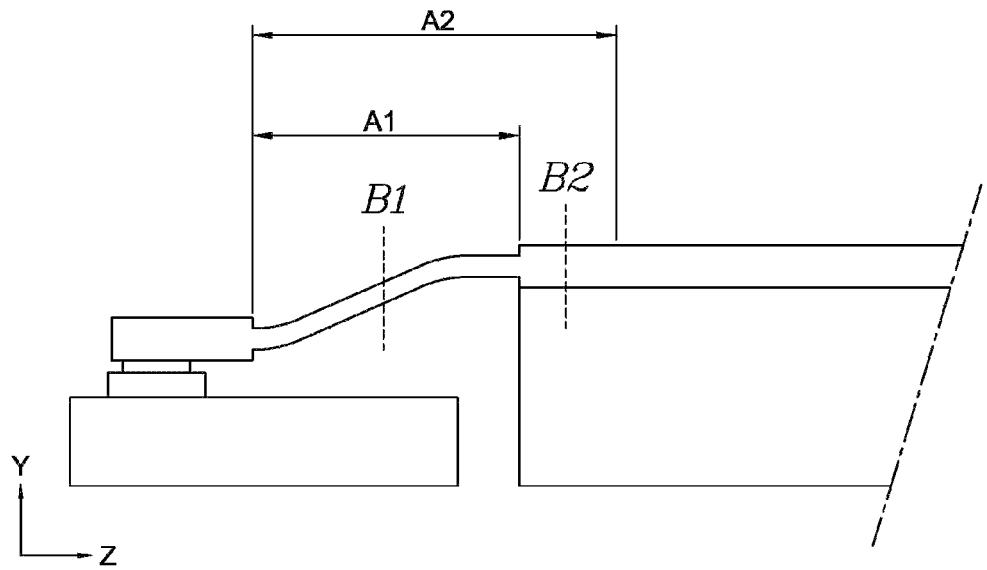
FIG. 1 is a view illustrating a thickness of an area to be bent.

In the drawings for explaining the present invention, positional relationships of components are described based on a width direction, a vertical direction, and a length direction, and in order to aid in the explanation, symbols X, Y, and Z shown in the drawings are respectively that X is a width direction, Y is a vertical direction, and Z is a length direction.

However, since this direction description is to help explain the positional relationships, this should not be interpreted limitedly, and it should be noted that the positional relationships are changeable according to a direction of vision.

A flexible circuit board that transmits high frequency signals is used within a wireless terminal (e.g., a smart phone, a tablet, or the like).

The flexible circuit board separately forms an area to be bent according to the need for bending due to a step difference in internal parts or a hinge of the wireless terminal.

As shown in FIG. 1, a thickness of an area A1 to be bent of the flexible circuit board is formed to be less than that of other areas.

Figure 2:
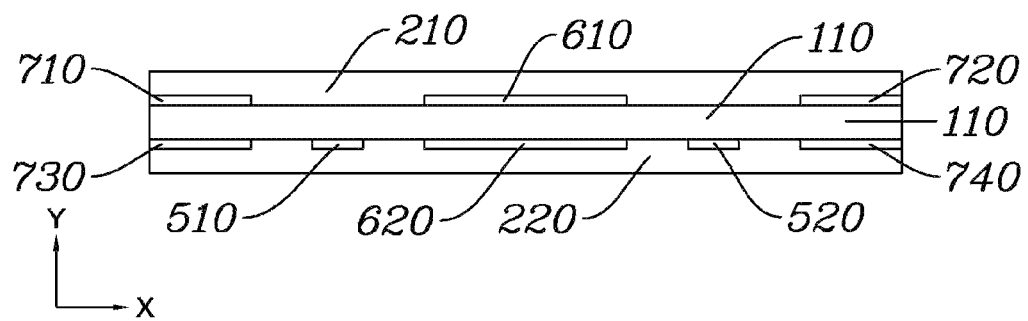
FIG. 2 is a cross-sectional view of an area to be bent.
Figure 3:
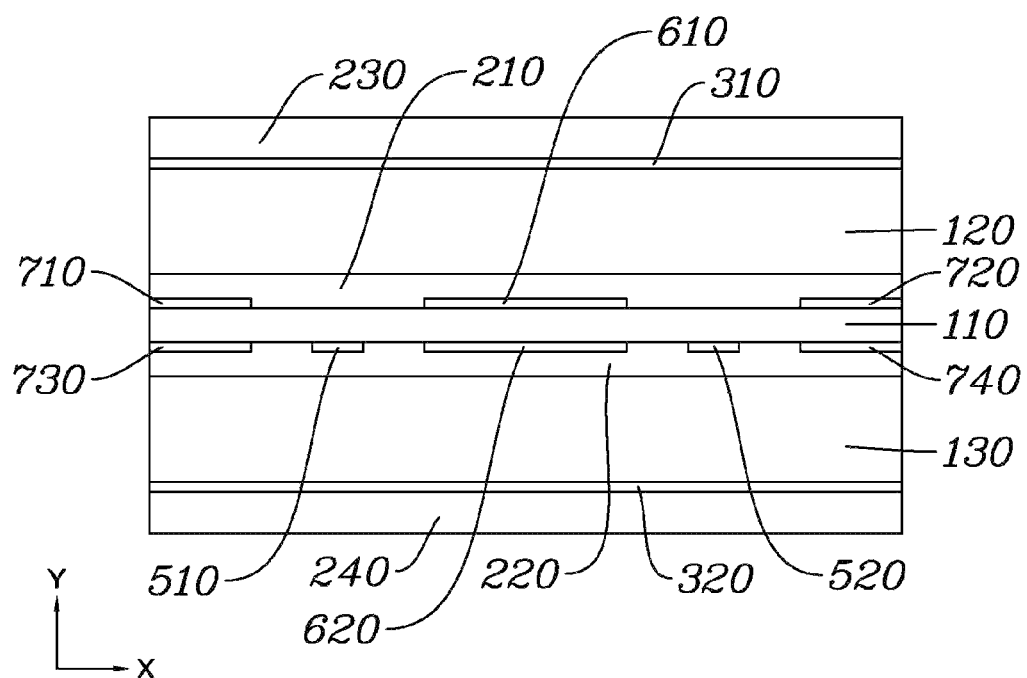
FIG. 3 is a cross-sectional view of another area adjacent to the area to be bent.

FIG. 2 is a cross-sectional view of an area to be bent, and FIG. 3 is a cross-sectional view of another area adjacent to the area to be bent.

The area to be bent shown in FIG. 2 has a problem in which it is vulnerable to noise interference due to a small thickness thereof by removal of components including a first ground 310 and a second ground 320 compared to other areas shown in FIG. 3.

In particular, in the case of a flexible circuit board composed of two or more signal lines, there is a problem that interference between signal lines occurs.

Figure 4:
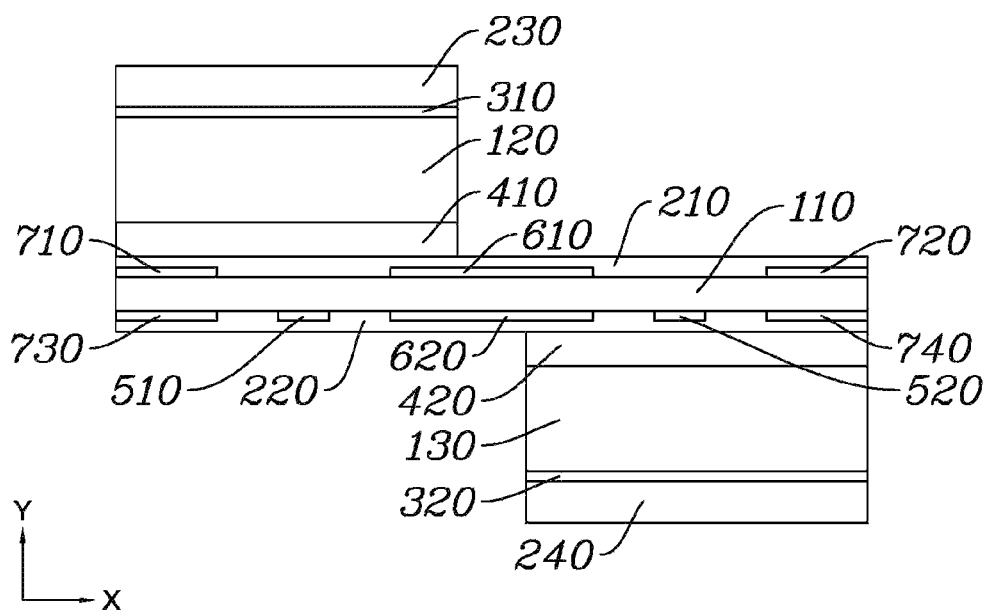
FIG. 4 to FIG. 9 are cross-sectional views of the area to be bent according to an embodiment of the present invention.
Figure 5:
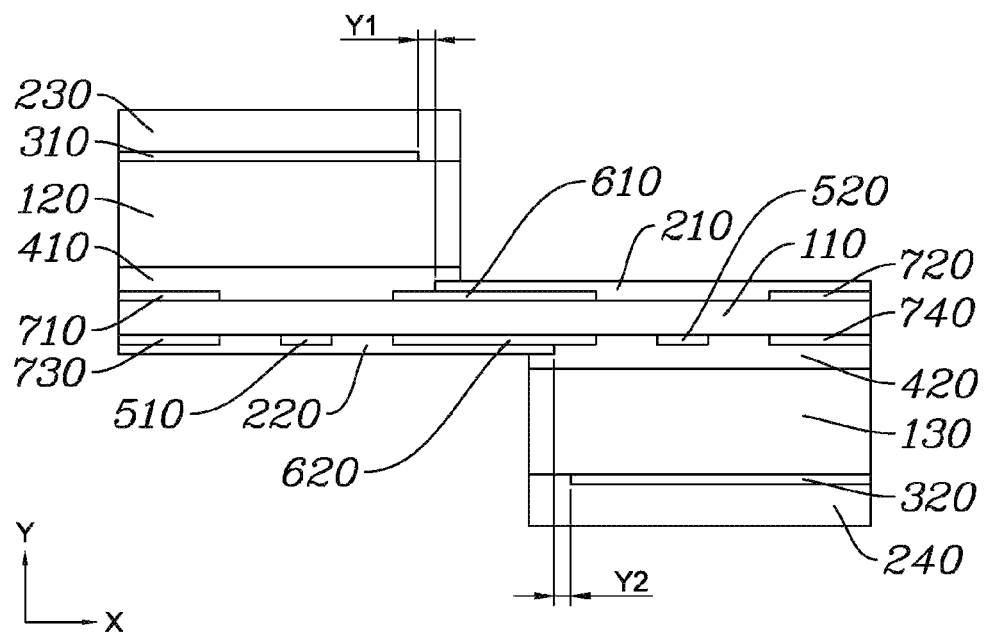

In order to solve this problem, a flexible circuit board having a bending part with improved shielding properties according to an embodiment of the present invention includes a first dielectric 110, a first signal line 510, a second signal line 520, a second dielectric 120, a third dielectric 130, a first cover 210, a second cover 220, a first ground 310, a second ground 320, a third cover 230, and a fourth cover 240, as shown in FIGS. 4 and 5.

The first dielectric 110 is formed to include a width direction and a length direction.

The first signal line 510 is positioned on one side in the width direction of an upper or a lower surface of the first dielectric 110.

The second signal line 520 is spaced apart from the first signal line 510 to the other side in the width direction and is positioned on the upper or lower surface of the first dielectric 110.

The second dielectric 120 is positioned on one side in the width direction above the first dielectric 110, and the first signal line 510 is positioned below the second dielectric 120.

The third dielectric 130 is spaced apart from the second dielectric 120 to the other side in the width direction and is positioned below the first dielectric 110, and the second signal line 520 is positioned above the third dielectric 130.

The first ground 310 is positioned on the second dielectric 120.

The second ground 320 is positioned under the third dielectric 130.

In this manner, the second dielectric 120 and the first ground 310 are formed only in a portion above the first dielectric 110 and have effects of shielding the first signal line 510 from being interfered by noise while maintaining bendability, and the third dielectric 130 and the second ground 320 are formed only in a portion below the first dielectric 110 and have effects of shielding the second signal line 520 from being interfered by noise while maintaining bendability.

In addition, the second dielectric 120 and the first ground 310, and the third dielectric 130 and the second ground 320 are point-symmetric to each other with respect to the first dielectric 110, so that there is an effect of shielding interference between the first signal line 510 and the second signal line 520.

A flexible circuit board having a bending part with improved shielding properties according to an embodiment of the present invention, as shown in FIGS. 4 and 5, includes the first cover 210, the second cover 220, and the third cover 230, and the fourth cover 240.

The first cover 210 is positioned on the first dielectric 110, but is formed from an entire or partial area below the second dielectric 120 to an area above the third dielectric 130 and thus, is positioned so that at least a part of the first cover 210 overlaps the second dielectric 120 in the vertical direction.

The second cover 220 is positioned under the first dielectric 110, but is formed from an entire or partial area above the third dielectric 130 to an area below the second dielectric 120 and thus, is positioned so that at least a part of the second cover 220 overlaps the third dielectric 130 in the vertical direction.

FIG. 4 illustrates an example in which the first cover 210 is formed from an entire area below the second dielectric 120 to the area above the third dielectric 130, and the second cover 220 is formed from an entire area above the third dielectric 130 to an area below the second dielectric 120, and FIG. 5 illustrates an example in which the first cover 210 is formed from a partial area below the second dielectric 120 to an area above the third dielectric 130, and the second cover 220 is formed from a partial area above the third dielectric 130 to an area below the second dielectric 120.

As shown in FIG. 4, the first cover 210 may overlap the entirety of the second dielectric 120 in the vertical direction, or, as shown in FIG. 5, the first cover 210 may overlap a portion of the second dielectric 120 in the vertical direction.

At this time, a part of the first cover 210 that overlaps at least a part of the second dielectric 120 in the vertical direction allows a portion where the second dielectric 120 is positioned above the first dielectric 110 and a portion where the second dielectric 120 is not positioned above the first dielectric 110 to be bent in conjunction with each other when bending the area to be bent, of the flexible circuit board, thereby preventing the portions from being damaged by bending thereof at different angles.

As shown in FIG. 4, the second cover 220 may overlap the entirety of the third dielectric 130 in the vertical direction, or, as shown in FIG. 5, the second cover 220 may overlap a part of the third dielectric 130 in the vertical direction.

At this time, a part of the second cover 220 that overlaps at least a part of the third dielectric 130 in the vertical direction allows a portion where the third dielectric 130 is positioned below the first dielectric 110 and a portion where the third dielectric 130 is not positioned below the first dielectric 110 to be bent in conjunction with each other when bending the area to be bent, of the flexible circuit board, thereby preventing the portions from being damaged due to bending thereof at different angles.

The third cover 230 is positioned on the first ground 310.

The fourth cover 240 is positioned under the second ground 320.

In this manner, the portion where the second dielectric 120 is positioned above the first dielectric 110 and the portion where the second dielectric 120 is not positioned above the first dielectric 110 may be bent in conjunction with each other, and the portion where the third dielectric 130 is positioned below the first dielectric 110 and the portion where the third dielectric 130 is not positioned below the first dielectric 110 may be bent in conjunction with each other, so that there are effects of preventing the portions from being damaged due to bending thereof at different angles.

The flexible circuit board having a bending part with improved shielding properties according to an embodiment of the present invention includes a first center ground 610, a second center ground 620, a first side ground 710, a second side ground 720, a third side ground 730, and a fourth side ground 740, as shown in FIGS. 4 and 5.

The first center ground 610 is positioned between the first signal line 510 and the second signal line 520, while being positioned on the upper surface of the first dielectric 110.

The second center ground 620 is positioned between the first signal line 510 and the second signal line 520, while being positioned on the lower surface of the first dielectric 110.

The second dielectric 120 is positioned to overlap at least a part of the first center ground 610 in the vertical direction.

The third dielectric 130 is positioned to overlap at least a part of the second center ground 620 in the vertical direction.

The first side ground 710 and the second side ground 720 are positioned on both sides in the width direction of the upper surface of the first dielectric 110 so that the first center ground 610 is positioned between the first side ground 710 and the second side ground 720.

The third side ground 730 and the fourth side ground 740 are positioned on both sides in the width direction of the lower surface of the first dielectric 110 so that the second center ground 620 is positioned between the third side ground 730 and the fourth side ground 740.

When the first signal line 510 is positioned on the upper surface of the first dielectric 110, the third side ground 730 and the second center ground 620 may be spaced apart without being connected to each other as shown, may be partially connected to each other to form a pattern, or may be entirely connected to each other.

When the first signal line 510 is positioned on the lower surface of the first dielectric 110, the first side ground 710 and the first center ground 610 may be spaced apart without being connected to each other as shown, may be partially connected to each other to form a pattern, or may be entirely connected to each other.

When the second signal line 520 is positioned on the upper surface of the first dielectric 110, the fourth side ground 740 and the second center ground 620 may be spaced apart without being connected to each other as shown, may be partially connected to each other to form a pattern, or may be entirely connected to each other.

When the second signal line 520 is positioned on the lower surface of the first dielectric 110, the second side ground 720 and the first center ground 610 may be spaced apart without being connected to each other as shown, may be partially connected to each other to form a pattern, or may be entirely connected to each other.

In this case, the pattern formed by the partially connecting may include a shape in which figures are periodically arranged by unconnected portions, or may include a net shape by connected portions.

In this manner, the first center ground 610 has effects of shielding the first signal line 510 from being interfered with by noise, together with the second dielectric 120 and the first ground 310, and the second center ground 620 has effects of shielding the second signal line 520 from being interfered with by noise, together with the third dielectric 130 and the second ground 320.

In addition, the first side ground 710 and the third side ground 730 have effects of shielding the first signal line 510 from being interfered with by noise, together with the first center ground 610 and the second center ground 620, and the second side ground 720 and the fourth side ground 740 have effects of shielding the second signal line 520 from being interfered with by noise, together with the first center ground 610 and the second center ground 620.

A positional relationship between the second dielectric 120 and the third dielectric 130 will be described as follows, with reference to FIGS. 6 to 8. (For reference, X1 is a range in which the second dielectric 120 overlaps the first center ground 610 in the vertical direction, and X2 is a range in which the third dielectric 130 overlaps the second center ground 620 in the vertical direction)

On the premise that the second dielectric 120 is positioned so that at least a part thereof overlaps the first center ground 610 in the vertical direction and the third dielectric 130 is positioned so that at least a part thereof overlaps the second center ground 620 in the vertical direction, the positional relationship between the second dielectric 120 and the third dielectric 130 in the horizontal direction will be described as follows.

Figure 6:
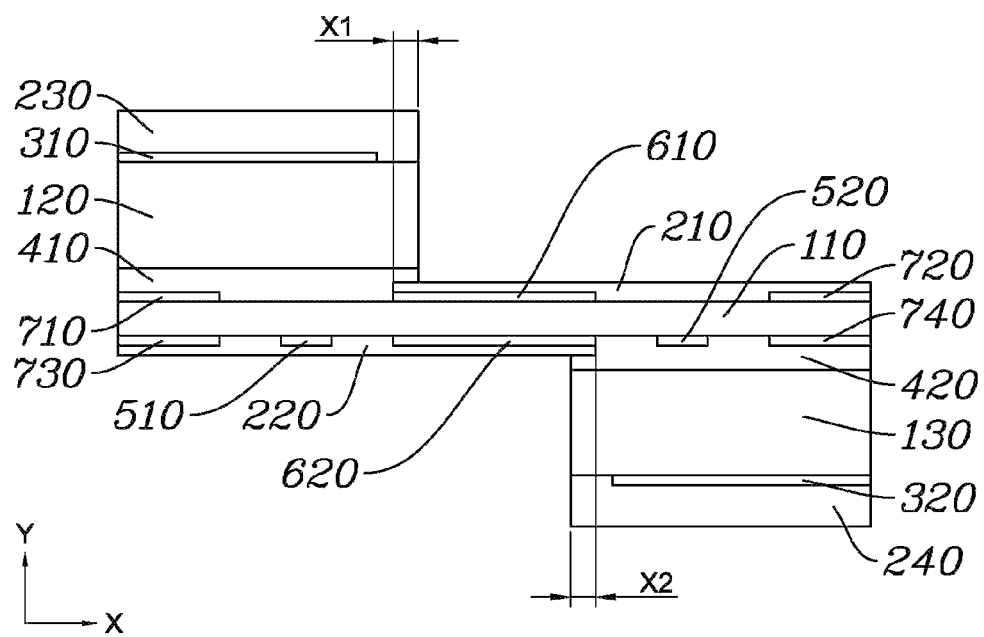

As shown in FIG. 6, the second dielectric 120 and the third dielectric 130 may be positioned to be spaced apart from each other in the horizontal direction.

Figure 7:
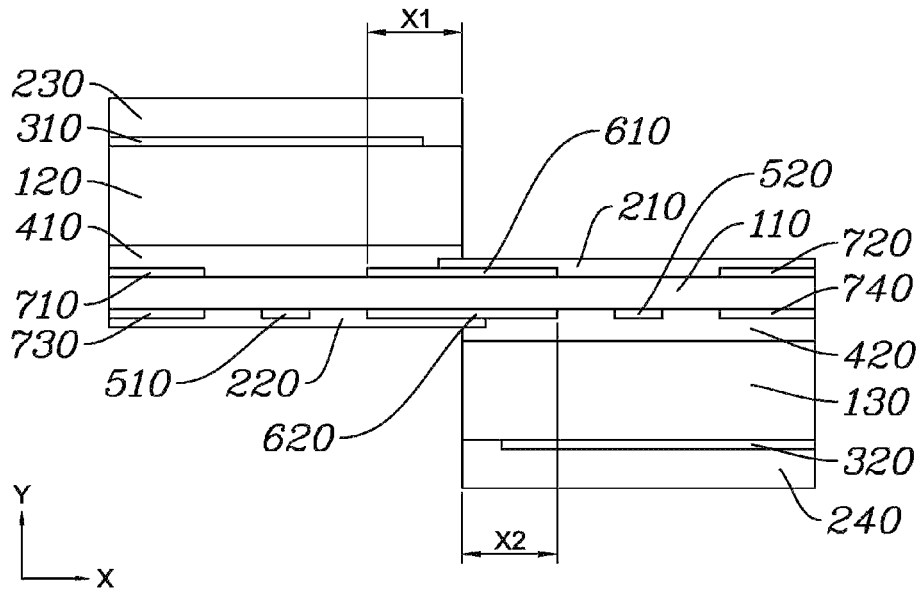

As shown in FIG. 7, the second dielectric 120 and the third dielectric 130 may be positioned adjacent to each other within a range in which they do not overlap each other in the vertical direction.

Figure 8:
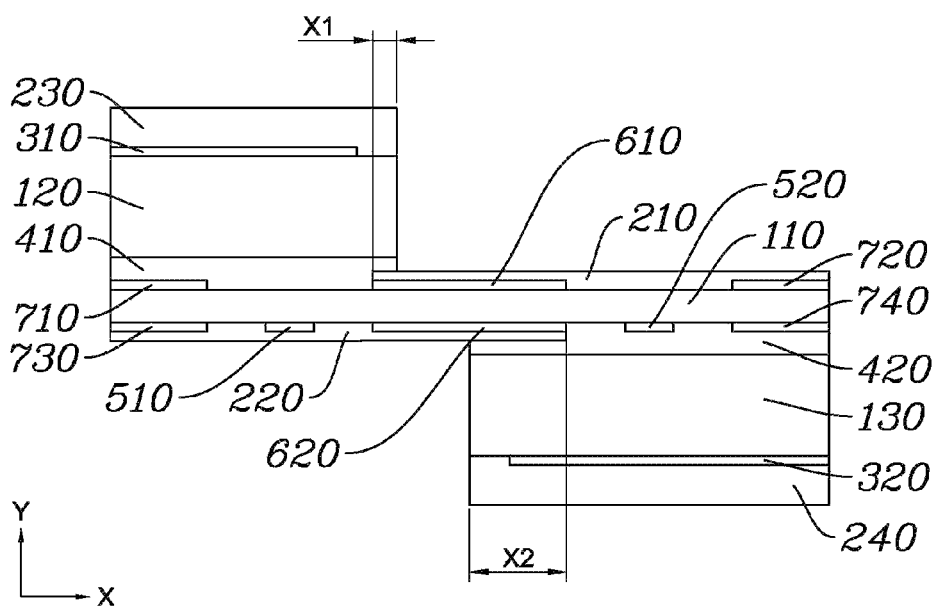

As shown in FIG. 8, a range in which the second dielectric 120 overlaps the first center ground 610 in the vertical direction may be different from a range in which the third dielectric 130 overlaps the second center ground 620 in the vertical direction.

A flexible circuit board having a bending part with improved shielding properties according to an embodiment of the present invention includes a first bonding sheet 410 and a second bonding sheet 420 as shown in FIGS. 4 and 5.

The first bonding sheet 410 is positioned between the first dielectric 110 and the second dielectric 120, and covers an upper portion of a part of the first cover 210, which is interposed between the first dielectric 110 and the second dielectric 120.

The second bonding sheet 420 is positioned between the first dielectric 110 and the third dielectric 130 and covers a lower portion of a part of the second cover 220, which is interposed between the first dielectric 110 and the third dielectric 130.

That is, the second dielectric 120 and the third dielectric 130 are coupled to the first dielectric 110 through the first bonding sheet 410 and the second bonding sheet 420, respectively.

At this time, although not shown, the second dielectric 120 and the third dielectric 130 may be directly bonded to the first dielectric 110 by high-temperature thermal bonding without the first bonding sheet 410 and the second bonding sheet 420.

When the first ground 310 overlaps the first cover 210 in the vertical direction, and the second ground 320 and the second cover 220 overlap in the vertical direction, there is a problem that a thickness of the flexible circuit board increases.

In order to solve this problem, a flexible circuit board having a bending part with improved shielding properties according to an embodiment of the present invention includes the following, as shown in FIG. 5.

The first ground 310 is formed to have a width smaller than a width of the second dielectric 120 so as not to overlap the first cover 210 in the vertical direction and is positioned to be spaced apart from the first cover 210 in the horizontal direction (refer to Y1).

The second ground 320 is formed to have a width smaller than a width of the third dielectric 130 so as not to overlap the second cover 220 in the vertical direction and is positioned to be spaced apart from the second cover 220 in the horizontal direction (refer to Y2).

In this manner, since the first ground 310 and the first cover 210 do not overlap in the vertical direction and the second ground 320 and the second cover 220 do not overlap in the vertical direction, there is an effect of preventing an increase in the thickness of the flexible circuit board.

Although the flexible circuit board on which two signal lines are formed has been described above with reference to FIGS. 4 and 5, an embodiment in a case where three signal lines are formed will be described with reference to FIG. 9.

Figure 9:
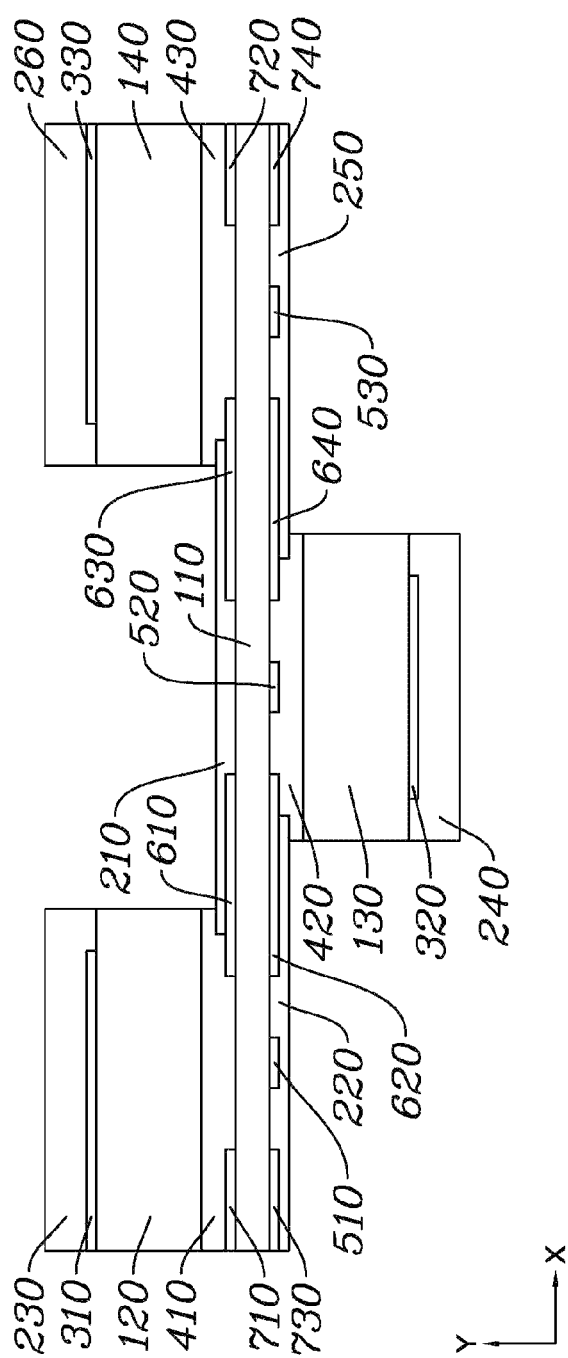

A flexible circuit board including a bending part with improved shielding properties according to an embodiment of the present invention includes a third signal line 530, a fourth dielectric 140, a fifth cover 250, and a third ground 330 and a sixth cover 260, as shown in FIG. 9.

The third signal line 530 is spaced apart from the second signal line 520 to the other side in the width direction and is positioned on the upper or lower surface of the first dielectric 110.

The fourth dielectric 140 is spaced apart from the third dielectric 130 to the other side in the width direction and is positioned above the first dielectric 110, and the third signal line 530 is positioned below the fourth dielectric 140.

The fifth cover 250 is positioned under the first dielectric 110, but is formed from an entire or partial area above the third dielectric 130 to an area below the fourth dielectric 140 and thus, is positioned so that at least a part of the fifth cover 250 overlaps the third dielectric 130 in the vertical direction.

The third ground 330 is positioned on the fourth dielectric 140.

The sixth cover 260 is positioned on the third ground 330.

The first cover 210 is formed in an entire or partial area below the fourth dielectric 140 and is positioned so that at least a part of the first cover 210 overlaps the fourth dielectric 140 in the vertical direction.

A flexible circuit board having a bending part with improved shielding properties according to an exemplary embodiment of the present invention includes a third center ground 630 and a fourth center ground 640 as shown in FIG. 9.

The third center ground 630 is positioned between the second signal line 520 and the third signal line 530, while being positioned on the upper surface of the first dielectric 110.

The fourth center ground 640 is positioned between the second signal line 520 and the third signal line 530, while being positioned on the lower surface of the first dielectric 110.

The fourth dielectric 140 is positioned so that at least a part of the fourth dielectric 140 overlaps the third center ground 630 in the vertical direction.

In this manner, the third center ground 630 has effects of shielding the third signal line 530 from being interfered with by noise, together with the fourth dielectric 140 and the third ground 330, and the fourth center ground 640 has effects of shielding the second signal line 520 from being interfered with by noise, together with the third dielectric 130 and the second ground 320.

A flexible circuit board having a bending part with improved shielding properties according to an embodiment of the present invention includes a third bonding sheet 430 as shown in FIG. 9.

The third bonding sheet 430 is positioned between the first dielectric 110 and the fourth dielectric 140, and covers an upper portion of a part of the first cover 210, which is interposed between the first dielectric 110 and the fourth dielectric 140.

The flexible circuit board having the bending part with improved shielding properties according to an embodiment of the present invention includes the following, as shown in FIG. 9.

The third ground 330 is formed to have a width smaller than a width of the fourth dielectric 140 so as not to overlap the first cover 210 in the vertical direction and is positioned to be spaced apart from the first cover 210 in the horizontal direction.

That is, the first cover 210 is not positioned below one end of the third ground 330, and the first cover 210 is positioned below the fourth dielectric 140 where one end of the first ground 310 is not positioned.

In this manner, since the third ground 330 and the first cover 210 do not overlap in the vertical direction, there is an effect of preventing an increase in the thickness of the flexible circuit board.

The flexible circuit board on which three signal lines are formed has been described above with reference to FIG. 9, but the present invention is not limited thereto, a dielectric added in a case in which there are 4 or more signal lines, and an adjacent dielectric thereof are located point-symmetrically with respect to the first dielectric 110, and a signal line, a ground, and a center ground that are added accordingly may be positioned based on the above description.

Previously, it has been described through FIGS. 4 to 9 that the first cover 210 is positioned so that at least part of the first cover 210 overlaps the second dielectric 120 in the width direction, but through FIGS. 10 and 11, it will be described as follows that the first cover 210 is positioned so that at least part of the first cover 210 overlaps the second dielectric 120 in the length direction.

Figure 10:
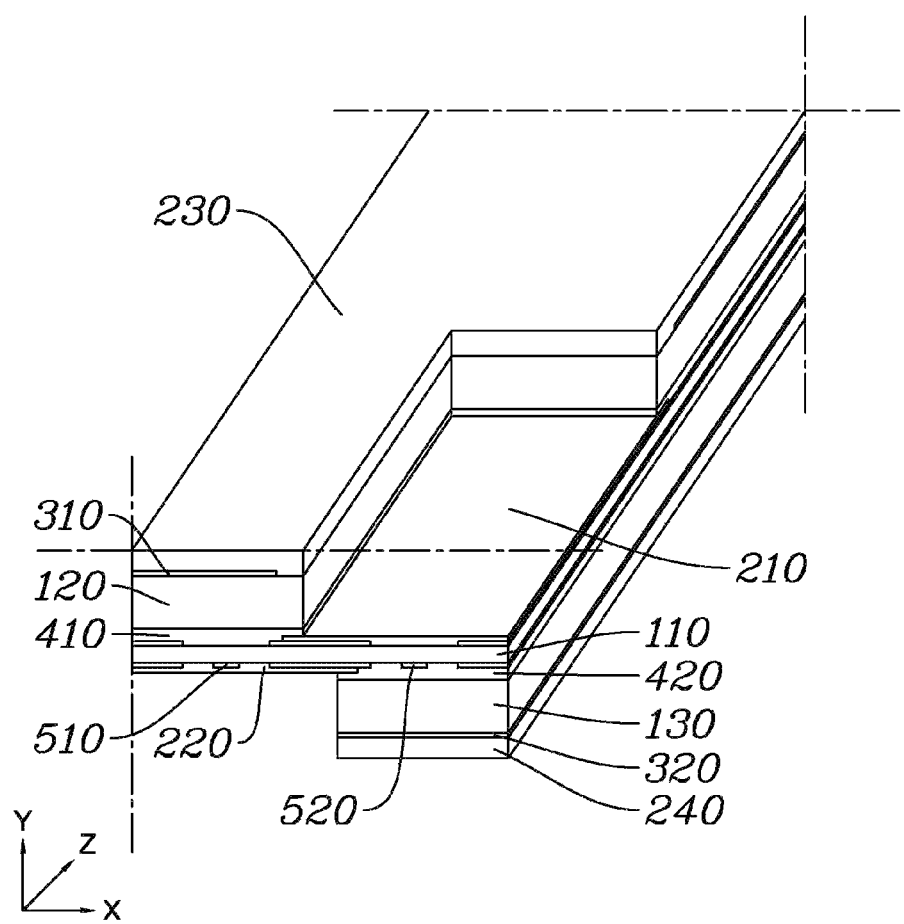
FIG. 10 is a view illustrating that a first cover is positioned so that at least a part of the first cover overlaps a second dielectric according to an embodiment of the present invention.

A flexible circuit board having a bending part with improved shielding properties according to an embodiment of the present invention includes the first dielectric 110, the first signal line 510, the second signal line 520, the first cover 210, the second cover 220, the second dielectric 120, the third dielectric 130, the first ground 310, the second ground 320, the third cover 230, and the fourth cover 240, as shown in FIG. 10.

The first dielectric 110 is formed to include the width direction and the length direction.

The first signal line 510 is positioned on one side in the width direction of the upper or lower surface of the first dielectric 110.

The first cover 210 is positioned on the first dielectric 110, while being formed to have a width smaller than the width of the first dielectric 110.

The second cover 220 is positioned under the first dielectric 110 and overlaps the first cover 210 at least partially in the vertical direction, while being formed to have a width smaller than the width of the first dielectric 110.

Figure 11:
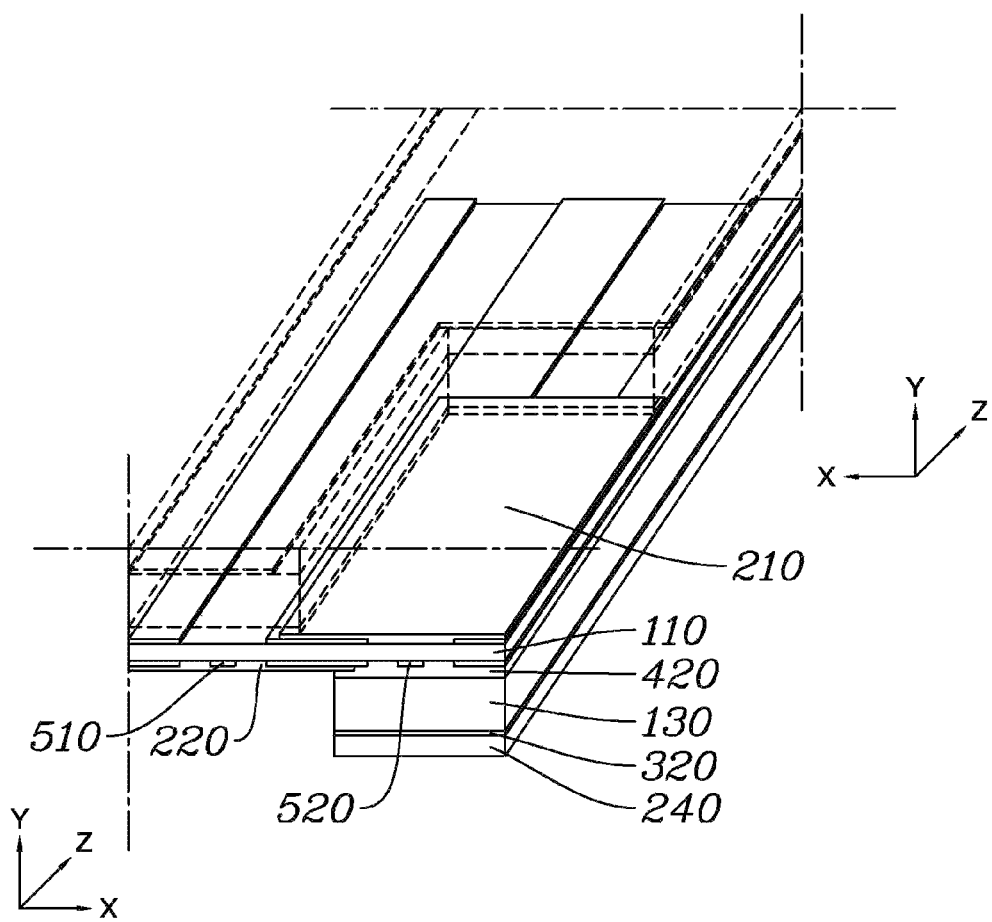
FIG. 11 is a partial perspective view illustrating that at least a part of the first cover overlaps the second dielectric according to an embodiment of the present invention.

FIG. 11 is a view where components above the first cover 210 are dotted to show a form in which the first cover 210 of FIG. 10 is interposed between the first dielectric 110 and the second dielectric 120.

Through FIG. 11, the form in which the first cover 210 is interposed between the first dielectric 110 and the second dielectric 120 will be described as follows.

The second dielectric 120 is positioned on one side in the width direction above the first dielectric 110, and the first signal line 510 is positioned below the second dielectric 120.

At this time, at least a part of one side of the first cover 210 in the length direction is interposed between the first dielectric 110 and the second dielectric 120, and a portion that is not interposed between the first dielectric 110 and the second dielectric 120 is exposed.

The third dielectric 130 is spaced apart from the second dielectric 120 to the other side in the width direction and is positioned below the first dielectric 110, and the second signal line 520 is positioned above the second dielectric 120.

At this time, at least a part of one side of the second cover 220 in the length direction is interposed between the first dielectric 110 and the third dielectric 130, and a portion that is not interposed between the first dielectric 110 and the third dielectric 130 is exposed.

At this time, not only at least a part of one side of the first cover 210 in the length direction, but also at least a part of one side of the first cover 210 in the width direction may be interposed between the first dielectric 110 and the second dielectric 120.

In addition, not only at least a part of one side of the second cover 220 in the length direction, but also at least a part of the other side of the second cover 220 in the width direction may be interposed between the first dielectric 110 and the third dielectric 130.

That is, the second dielectric 120 and at least a part of one side of the first cover 210 in the length direction may overlap in the vertical direction and additionally, the second dielectric 120 and at least a part of one side of the first cover 210 in the width direction may overlap in the vertical direction.

At this time, the part of the first cover 210 that overlaps at least a part of the second dielectric 120 in the vertical direction allows a portion where the second dielectric 120 is positioned above the first dielectric 110 and a portion where the second dielectric 120 is not positioned above the first dielectric 110 to be bent in conjunction with each other when bending the area to be bent, of the flexible circuit board, thereby preventing the portions from being damaged by bending thereof at different angles.

In addition, the third dielectric 130 and at least a part of one side of the second cover 220 in the length direction may overlap in the vertical direction and additionally, the third dielectric 130 and at least a part of one side of the second cover 220 in the width direction may overlap in the vertical direction.

At this time, the part of the second cover 220 that overlaps at least a part of the third dielectric 130 in the vertical direction allows a portion where the third dielectric 130 is positioned below the first dielectric 110 and a portion where the third dielectric 130 is not positioned below the first dielectric 110 to be bent in conjunction with each other when bending the area to be bent, of the flexible circuit board, thereby preventing the portions from being damaged due to bending thereof at different angles.

The first ground 310 is positioned on the second dielectric 120.

The second ground 320 is positioned under the third dielectric 130.

The third cover 230 is positioned on the first ground 310.

The fourth cover 240 is positioned under the second ground 320.

In this manner, the portion where the second dielectric 120 is positioned above the first dielectric 110 and the portion where the second dielectric 120 is not positioned above the first dielectric 110 may be bent in conjunction with each other, and the portion where the third dielectric 130 is positioned below the first dielectric 110 and the portion where the third dielectric 130 is not positioned below the first dielectric 110 may be bent in conjunction with each other, so that there are effects of preventing the portions from being damaged due to bending thereof at different angles.

Figure 12:
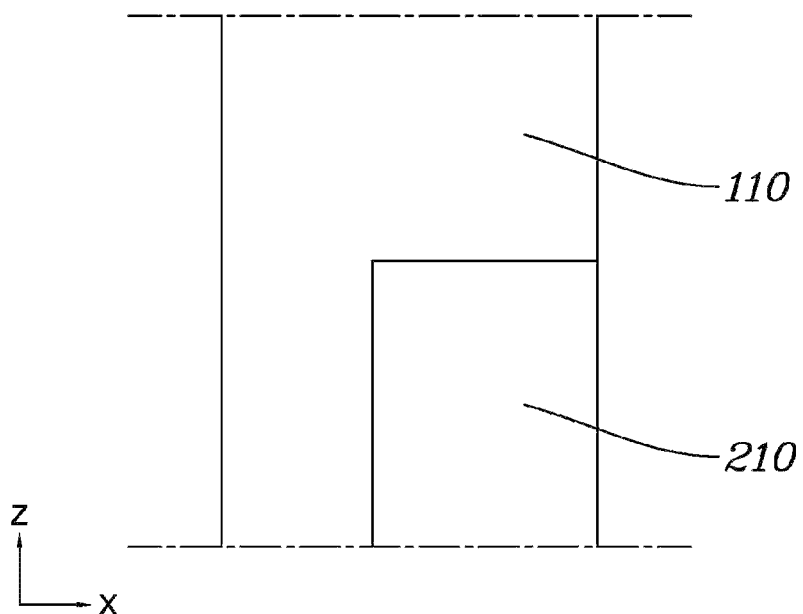
FIG. 12 to FIG. 14 are views of manufacturing steps according to embodiments of the present invention.
Figure 13:
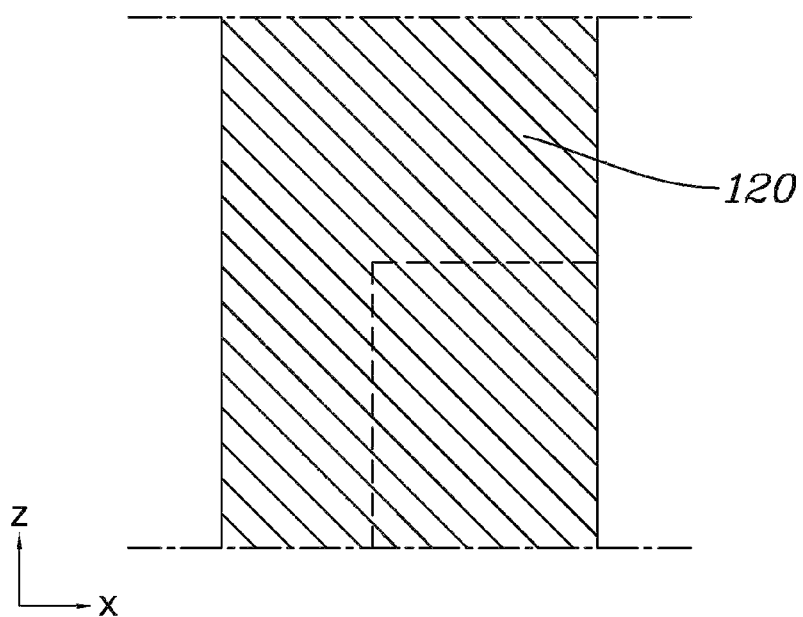
Figure 14:
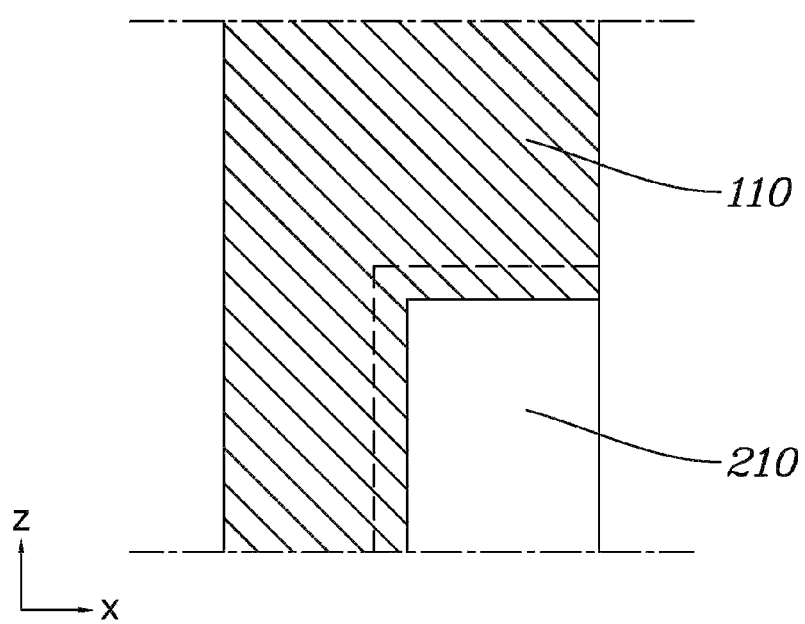

An embodiment of a manufacturing method of the flexible circuit board having the bending part with improved shielding properties according to an embodiment of the present invention includes a first step, a second step, and a third step, as shown in FIGS. 12 to 14.

In the first step, the first cover 210 is coupled onto the first dielectric 110.

In the second step, the second dielectric 120 is coupled onto the first dielectric 110 to cover the first cover 210.

In the third step, the second dielectric 120 positioned on the first cover 210 is removed so that the second dielectric 120 remains on at least a portion of a circumference of the first cover 210.

At this time, the removal may be removed by a method using a laser or a knife.

Another embodiment of a manufacturing method of the flexible circuit board having the bending part with improved shielding properties according to an embodiment of the present invention includes a first step and a second step, as shown in FIGS. 12 and 14.

In the first step, the first cover 210 is coupled onto the first dielectric 110.

In the second step, the second dielectric 120 which has been cut out to cover at least a part of the circumference of the first cover 210 is coupled onto the first dielectric 110.

DESCRIPTION OF REFERENCE NUMERALS

110: first dielectric 120: second dielectric
130: third dielectric 140: fourth dielectric
210: first cover 220: second cover
230: third cover 240: fourth cover
250: fifth cover 260: sixth cover
310: first ground 320: second ground
330: third ground 410: first bonding sheet
420: second bonding sheet 430: third bonding sheet
510: first signal line 520: second signal line
530: third signal line 610: first center ground
620: second center ground 630: third center ground
640: fourth center ground 710: first side ground
720: second side ground 730: third side ground
740: fourth side ground

We claim:

1. A flexible circuit board including a bending part with improved shielding properties, the flexible circuit board comprising:
    a first dielectric formed to include a width direction and a length direction;
    a first signal line positioned on one side in the width direction of an upper surface or a lower surface of the first dielectric;
    a second signal line spaced apart from the first signal line to the other side in the width direction and positioned on the upper surface or the lower surface of the first dielectric;
    a second dielectric positioned on one side in the width direction above the first dielectric and having the first signal line positioned below the second dielectric;
    a third dielectric spaced apart from the second dielectric to the other side in the width direction and positioned below the first dielectric, and having the second signal line positioned above the third dielectric;
    a first ground positioned on the second dielectric;
    a second ground positioned under the third dielectric; and
    a first center ground positioned between the first signal line and the second signal line and positioned on the upper surface of the first dielectric,
    wherein the first center ground does not overlap with the first signal line and the second signal line in a vertical direction, and
    wherein the first signal line and the second signal line are directly positioned on the same surface of the first dielectric.

2. The flexible circuit board of claim 1, further comprising:
    a first cover positioned on the first dielectric, but formed from an entire or partial area below the second dielectric to an area above the third dielectric, and positioned so that at least a part of the first cover overlaps the second dielectric in the vertical direction; and
    a second cover positioned under the first dielectric, but formed from an entire or partial area above the third dielectric to an area below the second dielectric, and positioned so that at least a part of the second cover overlaps the third dielectric in the vertical direction.

3. The flexible circuit board of claim 2, wherein the first ground is formed to have a width smaller than a width of the second dielectric so as not to overlap the first cover in the vertical direction and is positioned to be spaced apart from the first cover in a horizontal direction, wherein the second ground is formed to have a width smaller than a width of the third dielectric so as not to overlap the second cover in the vertical direction and is positioned to be spaced apart from the second cover in the horizontal direction.

4. The flexible circuit board of claim 1, further comprising:

a third cover positioned on the first ground; and
a fourth cover positioned under the second ground.

5. The flexible circuit board of claim 1, further comprising:

a second center ground positioned between the first signal line and the second signal line, while being positioned on the lower surface of the first dielectric, wherein the second dielectric is positioned to overlap at least a part of the first center ground in the vertical direction, wherein the third dielectric is positioned to overlap at least a part of the second center ground in the vertical direction.

6. The flexible circuit board of claim 5, further comprising:

a first side ground positioned on one side in the width direction of the upper surface of the first dielectric;
a second side ground positioned on the other side in the width direction of the upper surface of the first dielectric;
a third side ground positioned on one side in the width direction of the lower surface of the first dielectric; and
a fourth side ground positioned on the other side in the width direction of the lower surface of the first dielectric,
wherein the first center ground is positioned between the first side ground and the second side ground,
wherein the second center ground is positioned between the third side ground and the fourth side ground.

7. The flexible circuit board of claim 5, further comprising:

a first bonding sheet positioned between the first dielectric and the second dielectric and covering an upper portion of a part of the first cover, which is interposed between the first dielectric and the second dielectric; and
a second bonding sheet positioned between the first dielectric and the third dielectric and covering a lower portion of a part of the second cover, which is interposed between the first dielectric and the third dielectric.

8. The flexible circuit board of claim 1, further comprising:

a third signal line spaced apart from the second signal line to the other side in the width direction and positioned on the upper or lower surface of the first dielectric;
a fourth dielectric spaced apart from the third dielectric to the other side in the width direction and positioned above the first dielectric, and having the third signal line positioned below the fourth dielectric;
a fifth cover positioned under the first dielectric, but formed from an entire or partial area above the third dielectric to an area below the fourth dielectric, and positioned so that at least a part of the fifth cover overlaps the third dielectric in the vertical direction; and
a third ground positioned on the fourth dielectric.

9. The flexible circuit board of claim 8, further comprising:

a first cover positioned on the first dielectric, but formed from an entire or partial area below the second dielectric to an entire or partial area below the fourth dielectric, and positioned so that at least a part of the first cover overlaps the second dielectric and the fourth dielectric in the vertical direction;
a second cover positioned under the first dielectric, but formed from an entire or partial area above the third dielectric to an area below the second dielectric, and positioned so that at least a part of the second cover overlaps the third dielectric in the vertical direction; and
a fifth cover positioned under the first dielectric, but formed from an entire or partial area above the third dielectric to an area below the fourth dielectric, and positioned so that at least a part of the fifth cover overlaps the third dielectric in the vertical direction.

10. The flexible circuit board of claim 9, further comprising:

a first bonding sheet positioned between the first dielectric and the second dielectric and covering an upper portion of a part of the first cover, which is interposed between the first dielectric and the second dielectric;
a second bonding sheet positioned between the first dielectric and the third dielectric and covering a lower portion of a part of the second cover, which is interposed between the first dielectric and the third dielectric; and
a third bonding sheet positioned between the first dielectric and the fourth dielectric and covering an upper portion of a part of the first cover, which is interposed between the first dielectric and the fourth dielectric.

11. The flexible circuit board of claim 9, wherein the first ground is formed to have a width smaller than a width of the second dielectric so as not to overlap the first cover in the vertical direction and is positioned to be spaced apart from the first cover in a horizontal direction, wherein the second ground is formed to have a width smaller than a width of the third dielectric so as not to overlap the second cover and the fifth cover in the vertical direction and is positioned to be spaced apart from the second cover and the fifth cover in the horizontal direction, wherein the third ground is formed to have a width smaller than a width of the fourth dielectric so as not to overlap the first cover in the vertical direction and is positioned to be spaced apart from the first cover in the horizontal direction.

12. The flexible circuit board of claim 8, further comprising:

a third cover positioned on the first ground; and
a fourth cover positioned under the second ground; and
a sixth cover positioned on the third ground.

13. The flexible circuit board of claim 8, further comprising:

a second center ground positioned between the first signal line and the second signal line, while being positioned on the lower surface of the first dielectric,
a third center ground positioned between the second signal line and the third signal line on the upper surface of the first dielectric; and
a fourth center ground positioned between the second signal line and the third signal line on the lower surface of the first dielectric,
wherein the second dielectric is positioned to overlap at least a part of the first center ground in the vertical direction, wherein the third dielectric is positioned to overlap at least a part of the second center ground and the fourth center ground in the vertical direction, wherein the fourth dielectric is positioned so that at least a part of the fourth dielectric overlaps the third center ground in the vertical direction.

14. The flexible circuit board of claim 13, further comprising:

a first side ground positioned on one side in the width direction of the upper surface of the first dielectric;

a second side ground positioned on the other side in the width direction of the upper surface of the first dielectric;

a third side ground positioned on one side in the width direction of the lower surface of the first dielectric; and a fourth side ground positioned on the other side in the width direction of the lower surface of the first dielectric, wherein the first center ground and the third center ground are positioned between the first side ground and the second side ground, wherein the second center ground and the fourth center ground are positioned between the third side ground and the fourth side ground.

15. A manufacturing method of a flexible circuit board of claim 1, the flexible circuit board including a bending part with improved shielding properties, the manufacturing method comprising:

a first step of coupling a first cover onto a first dielectric;

a second step of coupling a second dielectric onto the first dielectric to cover the first cover; and a third step of removing the second dielectric positioned on the first cover so that the second dielectric remains on at least a part of a circumference of the first cover.

16. A manufacturing method of a flexible circuit board of claim 1, the flexible circuit board including a bending part with improved shielding properties, the manufacturing method comprising:

a first step of coupling a first cover onto a first dielectric; and a second step of coupling a second dielectric which has been cut out to cover at least a part of a circumference of the first cover, onto the upper portion of the first dielectric.

17. The flexible circuit board of claim 1, wherein the second dielectric is positioned only on one side in the width direction above the first center ground; and wherein the third dielectric is positioned only on the other side in the width direction below the first center ground.

18. A flexible circuit board including a bending part with improved shielding properties, the flexible circuit board comprising:

a first dielectric formed to include a width direction and a length direction;

a first signal line positioned on one side in the width direction of an upper surface or a lower surface of the first dielectric;

a second signal line spaced apart from the first signal line to the other side in the width direction and positioned on the upper surface or the lower surface of the first dielectric;

a first cover positioned on the first dielectric, while being formed to have a width smaller than a width of the first dielectric;

a second cover positioned under the first dielectric and overlapping the first cover at least partially in a vertical direction, while being formed to have a width smaller than the width of the first dielectric;

a second dielectric positioned on one side in the width direction above the first dielectric and having the first signal line positioned below the second dielectric;

a third dielectric spaced apart from the second dielectric to the other side in the width direction and positioned below the first dielectric, and having the second signal line positioned above the third dielectric;

a first ground positioned on the second dielectric;

a second ground positioned under the third dielectric;

a third cover positioned on the first ground;

a fourth cover positioned under the second ground, wherein at least a part of one side of the first cover in the length direction is interposed between the first dielectric and the second dielectric, and a portion of the first cover that is not interposed between the first dielectric and the second dielectric is exposed, and wherein at least a part of one side of the second cover in the length direction is interposed between the first dielectric and the third dielectric, and a portion of the second cover that is not interposed between the first dielectric and the third dielectric is exposed; and a first center ground positioned between the first signal line and the second signal line, and positioned on the upper surface of the first dielectric, wherein the first center ground does not overlap with the first signal line and the second signal line in the vertical direction and wherein the first signal line and the second signal line are directly positioned on the same surface of the first dielectric.

19. The flexible circuit board of claim 18, wherein at least a part of one side of the first cover in the width direction is interposed between the first dielectric and the second dielectric, at least a part of the other side in the width direction of the second cover is interposed between the first dielectric and the third dielectric.

* * * * *